(12) United States Patent
Kim (10) Patent No.: US 10,446,322 B2
(45) Date of Patent: *Oct. 15, 2019

(54) COMPOSITE ELECTRONIC COMPONENT AND BOARD HAVING THE SAME MOUNTED THEREON

(71) Applicant: Samsung Electro-Mechanics, Co., Ltd., Suwon-si, Gyeonggi-do (KR)

(72) Inventor: Ho Yoon Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/880,169

(22) Filed: Jan. 25, 2018

(65) Prior Publication Data

US 2018/0151298 A1 May 31, 2018

Related U.S. Application Data

(63) Continuation of application No. 15/436,085, filed on Feb. 17, 2017, now Pat. No. 10,043,613.

(30) Foreign Application Priority Data

Nov. 16, 2016 (KR) .................. 10-2016-0152725

(51) Int. Cl.
*H01G 4/002* (2006.01)
*H01G 4/012* (2006.01)
(Continued)

(52) U.S. Cl.
CPC ............ *H01G 4/30* (2013.01); *H01G 2/06* (2013.01); *H01G 4/002* (2013.01); *H01G 4/224* (2013.01);
(Continued)

(58) Field of Classification Search
USPC ......................................... 174/260; 361/272
See application file for complete search history.

(56) References Cited

U.S. PATENT DOCUMENTS

| 2013/0119552 A1 | 5/2013 | Lin et al. |
| 2015/0043125 A1 | 2/2015 | Park et al. |
| (Continued) | | |

FOREIGN PATENT DOCUMENTS

| CN | 103117279 A | 5/2013 |
| CN | 103168358 A | 6/2013 |
| (Continued) | | |

OTHER PUBLICATIONS

Non-Final Office Action issued in U.S. Appl. No. 15/436,085, dated Oct. 20, 2017.

(Continued)

*Primary Examiner* — Timothy J Thompson
*Assistant Examiner* — Guillermo J Egoavil
(74) *Attorney, Agent, or Firm* — Morgan, Lewis & Bockius LLP (57) ABSTRACT

A composite electronic component includes: a composite including a capacitor body including a plurality of dielectric layers and a plurality of internal electrodes alternately disposed with respective dielectric layers interposed therebetween, external electrodes extending from third and fourth surfaces of the capacitor body to portions of the first, second, fifth, and sixth surfaces, respectively, a discharge layer disposed between the external electrodes on the second surface of the capacitor body, and a protective layer disposed on the discharge layer; and conductive resin layers overlapping the third and fourth surfaces and portions of the first, second, fifth, and sixth surfaces, respectively. Widths of portions of the external electrodes formed on the first surface of the capacitor body are greater than widths of portions of (Continued)

the first and second conductive resin layers overlapping the first surface of the capacitor body.

10 Claims, 6 Drawing Sheets

(51) Int. Cl.
    *H01G 4/224*     (2006.01)
    *H01G 4/30*     (2006.01)
    *H05K 1/11*     (2006.01)
    *H01G 4/248*     (2006.01)
    *H05K 1/18*     (2006.01)
    *H01G 2/06*     (2006.01)
    *H01G 4/232*     (2006.01)
    *H05K 3/34*     (2006.01)

(52) U.S. Cl.
    CPC ........... *H01G 4/232* (2013.01); *H01G 4/2325* (2013.01); *H01G 4/248* (2013.01); *H05K 1/111* (2013.01); *H05K 1/181* (2013.01); *H01G 4/012* (2013.01); *H05K 3/3442* (2013.01); *H05K 2201/10015* (2013.01)

(56) References Cited

U.S. PATENT DOCUMENTS

| | | | |
|---|---|---|---|
| 2015/0340154 A1* | 11/2015 | Kim | H01G 2/14 |
| | | | 174/260 |
| 2016/0043047 A1 | 2/2016 | Shim et al. | |
| 2016/0211074 A1* | 7/2016 | Gu | H01G 2/065 |
| 2017/0076870 A1* | 3/2017 | Noda | H01G 4/30 |

FOREIGN PATENT DOCUMENTS

| | | |
|---|---|---|
| JP | 2016-157896 A | 9/2016 |
| KR | 10-2015-0018650 A | 2/2015 |
| KR | 10-2015-0135909 A | 12/2015 |
| TW | 201618196 A | 5/2016 |
| WO | 2012/012338 A1 | 1/2012 |

OTHER PUBLICATIONS

Office Action issued in the Taiwanese Patent Application No. 106104178, dated Apr. 30, 2018. (with English translation.).

\* cited by examiner

COMPOSITE ELECTRONIC COMPONENT AND BOARD HAVING THE SAME MOUNTED THEREON

CROSS-REFERENCE TO RELATED APPLICATION

This application is a Continuation of U.S. application Ser. No. 15/436,085, filed Feb. 17, 2017, which claims the benefit of priority to Korean Patent Application No. 10-2016-0152725, filed on Nov. 16, 2016 with the Korean Intellectual Property Office, the disclosures of which are incorporated herein by reference.

BACKGROUND

1. Technical Field

The present disclosure relates to a composite electronic component and a board having the same mounted thereon.

2. Description of Related Art

In recent years, there has been an increased tendency for portable electronic devices to have cases formed of a conductive metal material. Particularly, for the purpose of improving aesthetics and strength, in recent years, the front surfaces of portable electronic devices have increasingly been manufactured using metal frames.

Therefore, there is an increased need to prevent electrical shorts from occurring in the interior and on the exterior of electronic devices. In other words, there is an increased need for a means of protecting internal electronic components from external electrostatic discharge (ESD) or for preventing users from experiencing electric shocks due to internal electrical shorts.

SUMMARY

An aspect of the present disclosure provides a composite electronic component having excellent resistance to static electricity, and a board having the same mounted thereon.

According to an aspect of the present disclosure, a composite electronic component includes: a composite including a capacitor body including a plurality of dielectric layers, a plurality of first internal electrodes and a plurality of second internal electrodes alternately disposed with at least one of the plurality of dielectric layers interposed therebetween, the capacitor body having a first surface and a second surface opposing each other, a third surface and a fourth surface connecting the first surface and the second surface and opposing each other, and a fifth surface and a sixth surface connecting the first surface and the second surface, and connecting the third surface and the fourth surface, while opposing each other, and in which the plurality of first internal electrodes and the plurality of second internal electrodes are exposed to the third surface and the fourth surface, respectively, a first external electrode extending from the third surface of the capacitor body to portions of the first surface, the second surface, the fifth surface, and the sixth surface, and a second external electrode extending from the fourth surface of the capacitor body to portions of the first surface, the second surface, the fifth surface, and the sixth surface, a discharge layer disposed between the first and second external electrodes on the second surface of the capacitor body, and a protective layer disposed on the first external electrode, the second external electrode and the discharge layer, on the second surface of the capacitor body; a first conductive resin layer overlapping the third surface and portions of the first surface, the second surface, the fifth surface, and the sixth surface; and a second conductive resin layer overlapping the fourth surface and portions of the first surface, the second surface, the fifth surface, and the sixth surface. Widths of portions of the first external electrode and the second external electrode formed on the first surface of the capacitor body are greater than widths of portions of the first and second conductive resin layers overlapping the first surface of the capacitor body, respectively.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular-direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Composite Electronic Component

Hereinafter, an exemplary embodiment of the present disclosure will be described with reference to the accompanying drawings.

Figure 1:
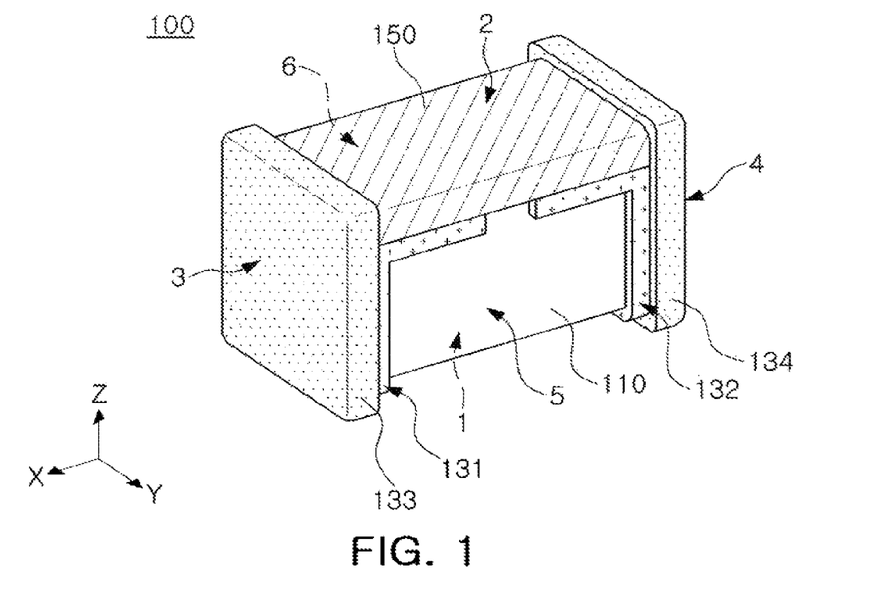
FIG. 1 is a perspective view schematically illustrating a composite electronic component according to an exemplary embodiment.
Figure 2:
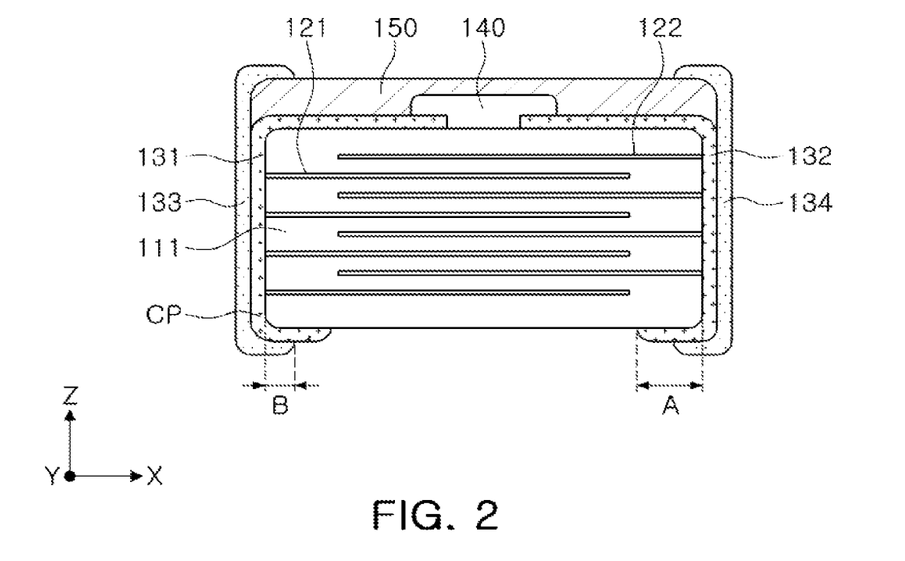
FIG. 2 is a cross sectional view taken in an X-Z direction of FIG. 1.
Figure 3A:
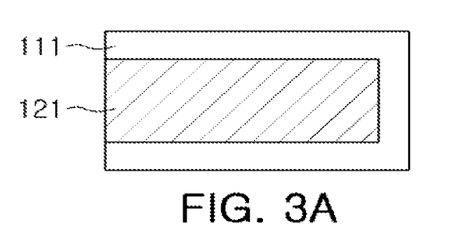
FIGS. 3A and 3B are plan views illustrating a first internal electrode and a second internal electrode applied to the composite electronic component of FIG. 1.
Figure 3B:
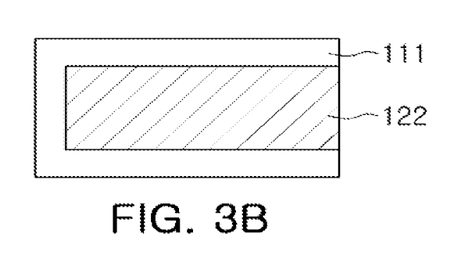
Figure 4:
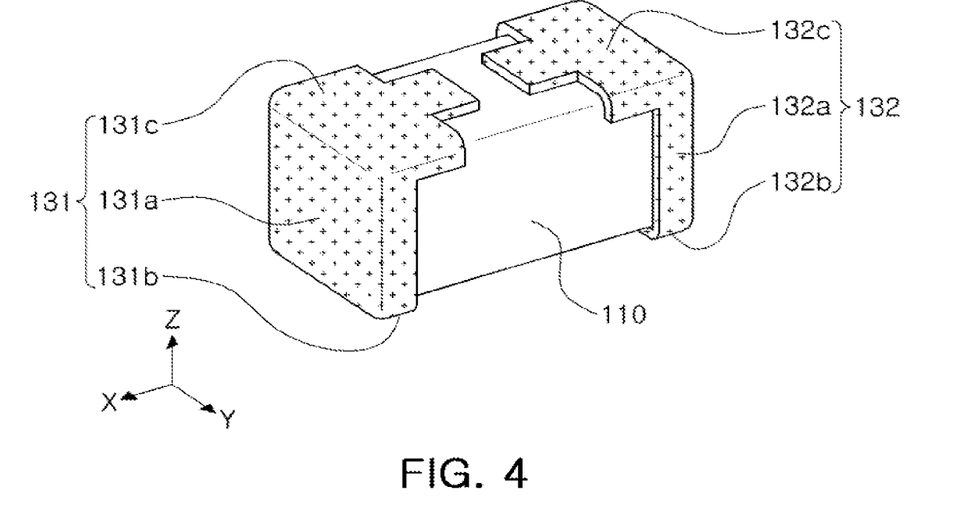
FIG. 4 is a perspective view illustrating that a first external electrode and a second external electrode are formed on a capacitor body in a composite electronic component according to an exemplary embodiment.
Figure 5:
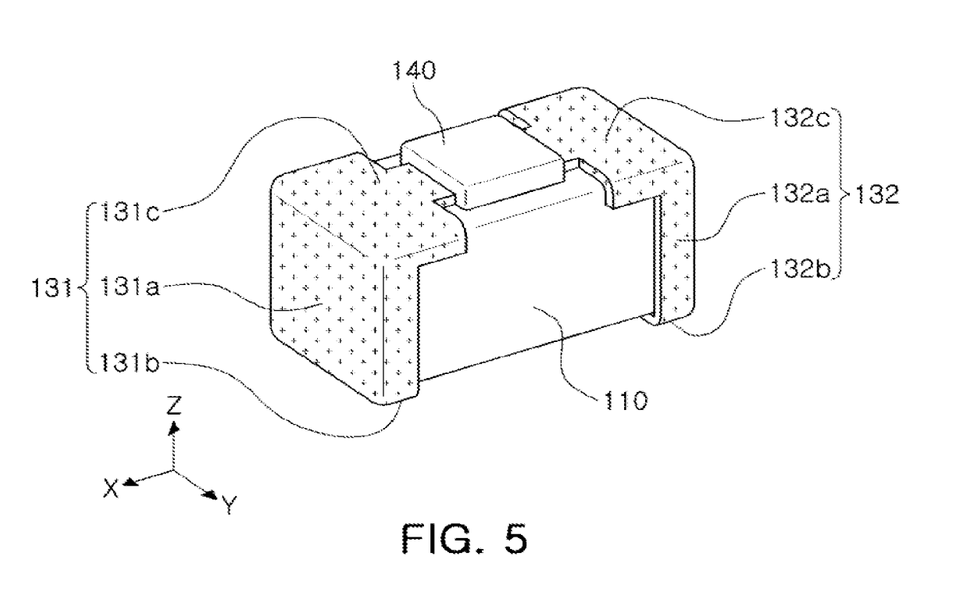
FIG. 5 is a perspective view illustrating that a discharge layer is further formed on the capacitor body of FIG. 4.
Figure 6:
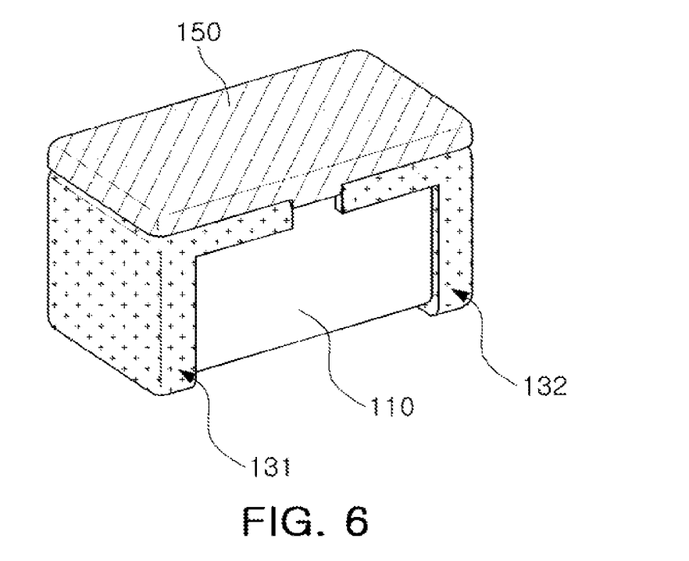
FIG. 6 is a perspective view illustrating that a protective layer is further formed on the capacitor body of FIG. 5.

FIG. 1 is a perspective view schematically illustrating a composite electronic component according to an exemplary embodiment, FIG. 2 is a cross sectional view taken in an X-Z direction of FIG. 1, FIGS. 3A and 3B are plan views illustrating a first internal electrode and a second internal electrode applied to FIG. 1, FIG. 4 is a perspective view illustrating a first external electrode and a second external electrode formed on a capacitor body in a composite electronic component according to an exemplary embodiment, FIG. 5 is a perspective view illustrating a discharge layer further formed in the capacitor body of FIG. 4, and FIG. 6 is a perspective view illustrating that a protective layer is further formed in the capacitor body of FIG. 5.

With reference to FIG. 1, in a composite electronic component 100 according to an exemplary embodiment, a 'length direction' is defined as an 'X' direction of FIG. 1, a 'width direction' is defined as a 'Y' direction, and a 'thickness direction' is defined as a 'Z' direction. Here, 'thickness direction' may be used in the same sense as a direction in which dielectric layers of a capacitor are stacked, in other words, a 'stacking direction'.

Meanwhile, length, width, and thickness directions of the composite electronic component 100, to be described later, are defined the same as length, width, and thickness directions of a capacitor body and an electrostatic discharge (ESD) protective device.

In addition, in an exemplary embodiment, the composite electronic component 100 may have a first surface 1 and a second surface 2 opposing each other in a Z-direction, a third surface 3 and a fourth surface 4 connecting the first surface 1 and the second surface 2 and opposing each other in an X-direction, and a fifth surface 5 and a sixth surface 6 connecting the first surface 1 and the second surface 2, connecting the third surface 3 and the fourth surface 4, and opposing each other in a Y-direction. In addition, a shape of the composite electronic component 100 is not limited, but may be a hexahedral shape as illustrated in FIG. 1.

In addition, in the composite electronic component 100, the first surface 1 and the second surface 2 in a Z-direction, the third surface 3 and the fourth surface 4 in an X-direction, and the fifth surface 5 and the sixth surface 6 in a Y-direction are defined as surfaces disposed in the same directions as a first surface to a sixth surface of a capacitor body and an ESD protective device, as will be described later.

Meanwhile, the composite electronic component 100 may have a form in which a capacitor and an ESD protective device are combined with each other. When the ESD protective device is combined with an upper part of the capacitor, a lower surface of the composite electronic component 100 is defined as a lower surface of the capacitor, and an upper surface of the composite electronic component 100 is defined as an upper surface of the ESD protective device.

With reference to FIGS. 1 to 6, the composite electronic component 100 according to an exemplary embodiment may include a composite including a capacitor body 110 having a plurality of dielectric layers 111, and a first internal electrode 121 and a second internal electrode 122 alternately disposed to oppose each other with a dielectric layer 111 interposed therebetween, a first external electrode 131 and a second external electrode 132 disposed on the capacitor body 110, a discharge layer 140 disposed between the first external electrode 131 and the second external electrode 132, and a protective layer 150.

In other words, the composite may be formed by combining the capacitor body 110 with the ESD protective device, but a method of formation of the composite is not limited thereto.

Here, the ESD protective device may include portions of the first external electrode 131 and the second external electrode 132, formed on the second surface 2 of the capacitor body 110, the discharge layer 140, and the protective layer 150.

For example, band portions of the first external electrode 131 and the second external electrode 132, the discharge layer 140, and the protective layer 150 may be sequentially disposed on the second surface 2 of the capacitor body 110 to form the composite.

In other words, in the composite electronic component 100 according to an exemplary embodiment, a stacked capacitor and an ESD protective device are combined with each other, and a first conductive resin layer 133 and a second conductive resin layer 134 are further included therein.

In an exemplary embodiment, the stacked capacitor may serve to filter a low-frequency noise component in a signal interface, an integrated circuit (IC) Block, or a communications line.

Hereinafter, each of the capacitor body 110 and the ESD protective device, forming the composite, will be described.

The capacitor body 110 is formed by stacking the plurality of dielectric layers 111 in a Z-direction, and a plurality of first internal electrodes 121 and a plurality of second internal electrodes 122 may be alternately disposed to be separated from each other with at least one of the plurality of dielectric layers 111 interposed therebetween inside the capacitor body 110.

In this case, the plurality of dielectric layers 111 forming the capacitor body 110 are in a sintered state, and boundaries among the plurality of dielectric layers 111 adjacent to each other may be integrated such that boundaries therebetween may not be readily apparent.

In addition, the dielectric layer 111 may be formed by firing a ceramic green sheet including ceramic powder, an organic solvent, and an organic binder. The ceramic powder is a material having high permittivity, and a barium titanate ($BaTiO_3$)-based material, a strontium titanate ($SrTiO_3$)-based material, or the like may be used, but the ceramic powder is not limited thereto.

The first internal electrode 121 is exposed through the third surface 3 of the capacitor body 110, and the second internal electrode 122 is exposed through the fourth surface 4 of the capacitor body 110.

The first internal electrode 121 and the second internal electrode 122 may be formed of a conductive paste containing a conductive metal. The conductive metal is not limited, and may be nickel (Ni), copper (Cu), palladium (Pd), or alloys thereof.

In addition, the first internal electrode 121 and the second internal electrode 122 may be formed by printing an internal electrode using a conductive paste in a printing method, such as a screen printing method, a gravure printing method or the like, on a ceramic green sheet forming the dielectric layer 111.

Thereafter, ceramic green sheets on which the first internal electrode 121 and the second internal electrode 122 are printed are alternately stacked and fired to form the capacitor body 110.

The first external electrode 131 may include a first connection portion 131a and first band portions 131b and 131c. The first connection portion 131a may be formed on the third surface 3 of the capacitor body 110, and may be connected to an exposed portion of the first internal electrode 121. The first band portions 131b and 131c may be formed to extend from the first connection portion 131a to portions of the first surface 1, the second surface 2, the fifth surface 5, and the sixth surface 6 of the capacitor body 110.

The second external electrode 132 may include a second connection portion 132a and second band portions 132b and 132c. The second connection portion 132a may be formed on the fourth surface 4 of the capacitor body 110, and may be connected to an exposed portion of the second internal electrode 122. The second band portions 132b and 132c may be formed to extend from the second connection portion 132a to portions of the first surface 1, the second surface 2, the fifth surface 5, and the sixth surface 6 of the capacitor body 110.

For example, when a length, in an X-direction, of the capacitor body 110 is 1 mm, each length, in an X-direction, of the first band portion 131b and the second band portion 132b, formed on the first surface 1 of the capacitor body 110, in the first external electrode 131 and the second external electrode 132, may be 100 μm to 400 μm.

The first external electrode 131 and the second external electrode 132 may be formed of a conductive paste including a conductive metal.

The conductive metal is not limited, and may be Ni, Cu, tin (Sn), or alloys thereof. In addition, the conductive paste may further include an insulating material. The insulating material is not limited, and, for example, may be glass.

Meanwhile, a method of formation of the first external electrode 131 and the second external electrode 132 is not particularly limited, and the first external electrode and the second external electrode may be formed by dipping the capacitor body 110. Alternatively, another method such as plating, or the like may be used.

An ESD protective device according to an exemplary embodiment may include portions, formed on the second surface of the capacitor body 110, of the first band portion 131c and the second band portion 132c of the first external electrode 131 and the second external electrode 132, the discharge layer 140, and the protective layer 150.

In this case, in the first external electrode 131 and the second external electrode 132, lengths in an X-direction of the first band portion 131c and the second band portion 132c formed on the second surface of the capacitor body 110 may be formed to be relatively longer than lengths of the first band portion 131b and the second band portion 132b formed on the first surface of the capacitor body 110, respectively.

The discharge layer 140 may include a conductive polymer, but is not limited thereto. In addition, the conductive polymer is not particularly limited, and may be, for example, a silicone-based resin.

The conductive polymer may have characteristics of a non-conductor in a case of a signal interface in which a signal is transmitted from a connector to a system or an IC, or in a case of an IC block of a power terminal, or in a case in which a level of a signal voltage input from a communications line is similar to a level of a rated voltage (a circuit voltage). However, the conductive polymer may have characteristics of a conductor when an overvoltage such as an ESD or the like occurs instantaneously.

When the overvoltage such as an ESD or the like occurs, due to the discharge layer 140 having characteristics of a conductor, a short circuit may occur between the first band portion 131c and the second band portion 132c of the first external electrode 131 and the second external electrode 132.

Thus, the overvoltage such as an ESD or the like may bypass to ground through the ESD protective device, thereby protecting the signal interface, the IC Block, or the communications line.

Meanwhile, in an exemplary embodiment, since the discharge layer 140 includes a conductive polymer, a silicone-based resin, the ESD protective device may be combined with an outer surface of the capacitor body 110, and may not be disposed inside the capacitor body 110.

In this case, the boiling point of the silicone-based resin is significantly lower than a firing temperature of the capacitor body 110. In a case in which the silicone-based resin is disposed inside the capacitor body 110, the silicone-based resin may be evaporated to be removed.

As an electrical overstress (EOS) protective device according to the related art, a varistor includes zinc oxide, a raw material, and has a shape in which Pd or silver (Ag) electrodes are opposed in a stacking direction to be stacked, with the zinc oxide interposed therebetween.

However, an ESD protective device according to an exemplary embodiment is an ESD suppressor in which the first band portion 131c and the second band portion 132c are disposed to be opposed on the second surface of the capacitor body 110, and has differences from the varistor in terms of a structure and an action.

According to an exemplary embodiment, the ESD protective device may bypass an overvoltage such as an ESD or the like due to the first band portion 131c and the second band portion 132c, and the discharge layer 140 interposed therebetween. However, the varistor may act as an insulator with respect to a rated voltage, but may act as a variable resistor to bypass an overvoltage when an overvoltage occurs.

The protective layer 150, in the ESD protective device, may serve to protect the first band portion 131c and the second band portion 132c, and the discharge layer 140 interposed therebetween, from an external environment. A material of the protective layer is not particularly limited.

In addition, since the ESD protective device is combined with an outer surface of the capacitor body 110, the protective layer 150 may be an essential component to protect the ESD protective device from an external environment.

The first conductive resin layer 133 may be formed to overlap the third surface 3 of the capacitor body 110 to portions of the first surface 1, the second surface 2, the fifth surface 5, and the sixth surface 6 thereof. In addition, the second conductive resin layer 134 may be formed to overlap the fourth surface 4 of the capacitor body 110 to portions of the first surface 1, the second surface 2, the fifth surface 5, and the sixth surface 6 thereof.

In this case, widths B of the first conductive resin layer 133 and the second conductive resin layer 134 overlapping the first surface 1 of the capacitor body 110 are narrower than widths A of the first external electrode 131 and the second external electrode 132 formed on the first surface 1 of the capacitor body 110, respectively.

In this case, when a width of each of the first conductive resin layer 133 and the second conductive resin layer 134 overlapping the first surface 1 of the capacitor body 110 is B and a width of each of the first external electrode 131 and the second external electrode 132 formed on the first surface 1 of the capacitor body 110 is A, B/A may be 0.3 to 0.98.

When B/A is less than 0.3, bonding forces of the first conductive resin layer 133 and the second conductive resin layer 134 are lowered, and thus, a phenomenon in which a portion of the protective layer 150 is separated from the capacitor body 110 may occur.

When B/A exceeds 0.98, a level of equivalent series resistance (ESR) at 1 GHz may exceed 200 mΩ, and a phenomenon in which the first conductive resin layer 133 and the second conductive resin layer 134 are burnt may occur.

The composite electronic component 100 according to an exemplary embodiment may serve to filter a noise component of an input signal, as the first conductive resin layer 133 and the second conductive resin layer 134 are connected to the first internal electrode 121 and the second internal electrode 122 of the capacitor body 110 through the first external electrode 131 and the second external electrode 132.

In this case, the first conductive resin layer 133 and the second conductive resin layer 134 are connected to portions of the first band portion 131c and the second band portion 132c of the first external electrode 131 and the second external electrode 132 of the ESD protective device, formed on the second surface 2 of the capacitor body 110, to bypass an overvoltage whose level is equal to or more than a level of a rated voltage.

In addition, in the composite electronic component 100 according to an exemplary embodiment, a mounting surface is a surface in which the first band portion 131b and the second band portion 132b of the first external electrode 131 and the second external electrode 132 are exposed. Thus, a direction on which a composite is mounted may be easily identified with the naked eye.

Figure 7:
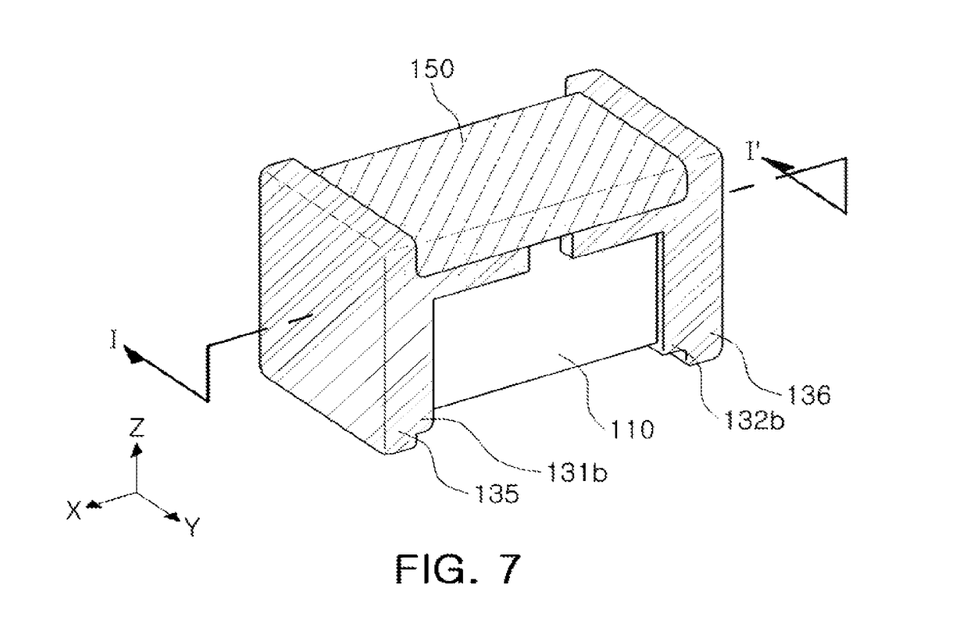
FIG. 7 is a perspective view illustrating that a plating layer is further formed in the composite electronic component of FIG. 1.
Figure 8:
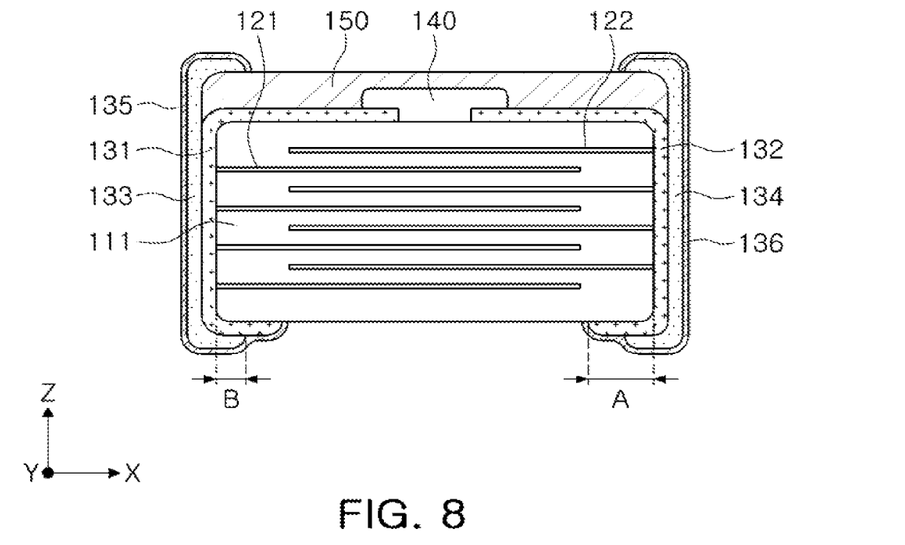
FIG. 8 is a cross-sectional view taken along line I-I' of FIG. 7.

Furthermore, as illustrated in FIGS. 7 and 8, a first plating layer 135 and a second plating layer 136 due to nickel/tin (Ni/Sn) plating may be further disposed on the first conductive resin layer 133 and the second conductive resin layer 134, and externally exposed portions of the first band portion 131b and the second band portion 132b in lower portions of the first external electrode 131 and the second external electrode 132.

In this case, in each of the first plating layer 135 and the second plating layer 136, a length in an X-direction of a part thereof formed on the first surface 1 of the composite may be greater than a length in an X-direction of a part thereof formed on the second surface 2 of the composite.

Figure 9:
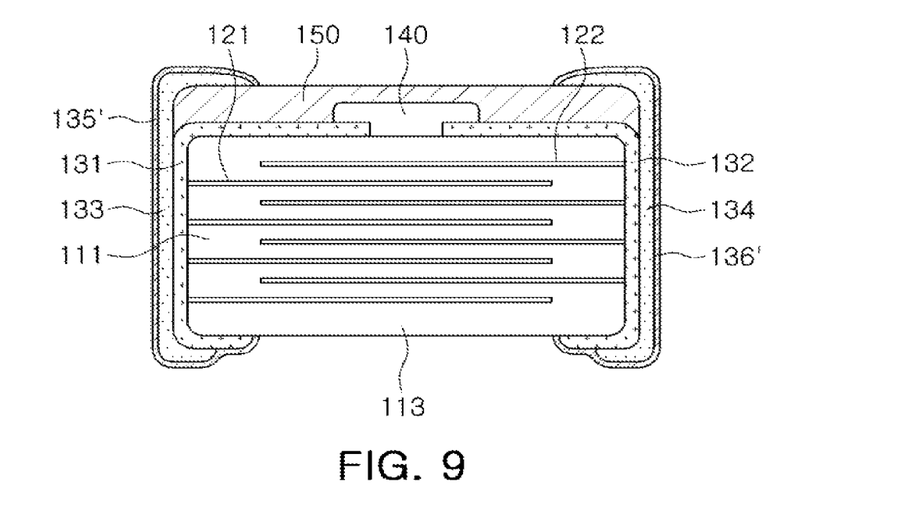
FIG. 9 is a cross-sectional view illustrating another embodiment in which a plating layer of a composite electronic component according to the present disclosure is deformed.

In another exemplary embodiment, as illustrated in FIG. 9, in each of a first plating layer 135' and a second plating layer 136', a length in an X-direction of a part thereof formed on the first surface 1 of the composite may be the same as a length in an X-direction of a part thereof formed on the second surface 2 of the composite.

EXPERIMENTAL EXAMPLE

In a composite electronic component according to an example and a comparative example of the present disclosure, a length×a width×a height of a capacitor body is 1.0 mm×0.5 mm×0.5 mm. In Table 1, A is a width, in an X-direction, of each of a first band portion and a second band portion of a first external electrode and a second external electrode formed on a first surface of the capacitor body, and B is a width, in an X-direction, of each of a first conductive resin layer and a second conductive resin layer formed on the first surface of the capacitor body.

In Table 1, when values of A and B are changed for each sample, whether a separation phenomenon between a protective layer and a capacitor body occurs, whether ESR is increased, and whether a phenomenon in which a conductive resin electrode layer is burnt occurs, are determined to be described.

In this case, an experiment for determining whether a separation phenomenon between a protective layer and a capacitor body occurs, determines whether a protective layer is separated from a capacitor body through a test using a tape with strength of 600 gf/25 mm. ESR is determined to be NG when a value measured at 1 GHz exceeds 200 mΩ.

In an experiment for determining whether a phenomenon in which a conductive resin electrode layer is burnt occurs, whether a phenomenon in which a first conductive resin layer and a second conductive resin layer are burnt occurs, after a current of 8 kV is applied to a composite electronic component 100 times at an interval of one second, is determined with the naked eye. In this case, Cp [pF] is 100, Df is at most 0.001, and IR is at least $1.0\ E^{10}$.

TABLE 1

| # | A [μm] | B [μm] | B/A | Whether of separation of protective layer | ESR characteristics | ESD durability |
|---|---|---|---|---|---|---|
| 1 | 301 | 10 | 0.03 | Separated | OK | OK |
| 2 | 304 | 41 | 0.13 | Separated | OK | OK |
| 3 | 298 | 69 | 0.23 | Separated | OK | OK |
| 4 | 300 | 90 | 0.30 | Good | OK | OK |
| 5 | 298 | 128 | 0.43 | Good | OK | OK |
| 6 | 310 | 150 | 0.48 | Good | OK | OK |
| 7 | 305 | 183 | 0.60 | Good | OK | OK |
| 8 | 304 | 210 | 0.69 | Good | OK | OK |
| 9 | 298 | 241 | 0.81 | Good | OK | OK |
| 10 | 301 | 278 | 0.92 | Good | OK | OK |
| 11 | 304 | 298 | 0.98 | Good | OK | OK |
| 12 | 302 | 310 | 1.03 | Good | NG | NG |
| 13 | 298 | 335 | 1.12 | Good | NG | NG |
| 14 | 299 | 345 | 1.15 | Good | NG | NG |

With reference to Table 1, in the case of samples 1-3 in which B/A was less than 0.3, adhesion of a conductive resin layer was weak. Thus, a phenomenon in which a portion of a protective layer is separated from a capacitor body occurred. In addition, contact properties between a conductive resin layer and an external electrode were reduced, thereby increasing ESR.

In addition, in the case of samples 12-14 in which B/A exceeded 0.98, ESR at 1 GHz exceeded 200 mΩ, and a burnt phenomenon in a first conductive resin layer and a second conductive resin layer occurred. The burnt phenomenon caused the formation of cracks inside the capacitor body 110, thereby causing capacitance and insulation resistance failure in composite electronic components.

Thus, a numerical range of B/A, for stably securing ESR characteristics and ESD durability while preventing a separation phenomenon of a protective layer and a capacitor body, is determined to be 0.3 to 0.98.

Mounting Board of Composite Electronic Component

Figure 10:
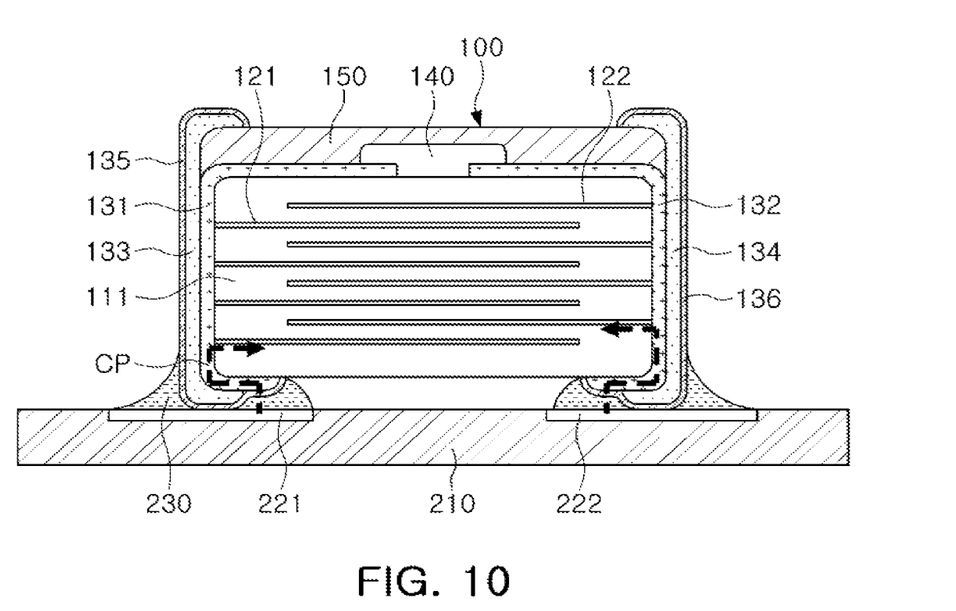
FIG. 10 is a cross-sectional view illustrating that the composite electronic component of FIG. 7 is mounted on a board.

FIG. 10 is a cross-sectional view illustrating the composite electronic component of FIG. 7 mounted on a board.

With reference to FIG. 10, a mounting board of a composite electronic component according to an exemplary embodiment may include a board 210 on which a composite electronic component 100 is mounted, and a first electrode pad 221 and a second electrode pad 222, formed on an upper surface of the board 210.

In this case, the composite electronic component 100 may be electrically connected to the board 210 by a solder 230 while the first plating layer 135 and the second plating layer 136 formed on the first conductive resin layer 133 and the second conductive resin layer 134 are located above the first electrode pad 221 and the second electrode pad 222 to be connected thereto, respectively.

The first conductive resin layer 133 and the second conductive resin layer 134 are required to be formed of an epoxy series material such as Cu epoxy or Ag epoxy to be cured at a low temperature, since the first conductive resin layer and the second conductive resin layer are formed, as a first band portion 131c, a second band portion 132c, a discharge layer 140, and a protective layer 150 are formed on a second surface 2 of the capacitor body 110 to apply conductive resin paste thereabove.

In this case, as resistivity of the first conductive resin layer 133 and the second conductive resin layer 134 is greater than resistivity of a first external electrode 131 and a second external electrode 132, a problem, in which ESR of a capacitor is increased and contact properties between a conductive resin layer and an external electrode are lowered when current is applied, may occur. The problem described above may cause an increase in a ripple of a signal current flowing in a circuit or distortion of a signal, when a composite electronic component is mounted on a board.

According to an exemplary embodiment, a width, in an X-direction, of each of the first conductive resin layer 133 and the second conductive resin layer 134 formed on the first surface 1 of the composite is less than a width, in an X-direction, of each of the first band portion 131b and the second band portion 132b of the first external electrode 131 and the second external electrode 132 formed on the first surface 1 of the capacitor body 110.

Current has characteristics of flowing through a conducting wire with low resistance first. In this case, due to a structure described above, the solder 230 is directly in contact with the first band portion 131b and the second band portion 132b of the first external electrode 131 and the second external electrode 132. Thus, a current path (CP) is formed to allow current to flow not into the first conductive resin layer 133 and the second conductive resin layer 134, but into the first external electrode 131 and the second external electrode 132 exposed externally, thereby suppressing an increase in ESR. In addition, failure of an electrical connection due to a reduction in contact properties at an interface between the first conductive resin layer 133 and the first external electrode 131 and at an interface between the second conductive resin layer 134 and the second external electrode 132 may be prevented.

As set forth above, according to an exemplary embodiment, a composite electronic component having excellent durability to static electricity, and a board having the same mounted thereon may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
   a composite including:
   a capacitor body including a plurality of dielectric layers, a plurality of first internal electrodes and a plurality of second internal electrodes alternately disposed with at least one of the plurality of dielectric layers interposed therebetween, and a first surface and a second surface opposing each other, a third surface and a fourth surface connecting the first surface and the second surface and opposing each other, and a fifth surface and a sixth surface connecting the first surface and the second surface, and connecting the third surface and the fourth surface, while opposing each other, and in which the plurality of first internal electrodes and the plurality of second internal electrodes are exposed to the third surface and the fourth surface, respectively,
   a first external electrode extending from the third surface of the capacitor body to portions of the first surface, the second surface, the fifth surface, and the sixth surface, and a second external electrode extending from the fourth surface of the capacitor body to portions of the first surface, the second surface, the fifth surface, and the sixth surface, a discharge layer disposed between the first external electrode and the second external electrode on the second surface of the capacitor body, and a protective later disposed on the first external electrode, the second external electrode, and the discharge layer, on the second surface of the capacitor body;

a first conductive resin layer overlapping the third surface and portions of the first surface, the second surface, the fifth surface, and the sixth surface; and a second conductive resin layer overlapping the fourth surface and portions of the first surface, the second surface, the fifth surface, and the sixth surface;

wherein widths of portions of the first external electrode and the second external electrode formed on the first surface of the capacitor body are greater than widths of portions of the first conductive resin layer and the second conductive resin layer overlapping the first surface of the capacitor body, respectively, wherein B/A is 0.03 to 0.98 in which A is widths of portions of the first external electrode and the second external electrode formed on the first surface of the capacitor body, and B is widths of portions of the first conductive resin layer and the second conductive resin layer overlapping the first surface of the capacitor body, and wherein the first and second internal electrodes are formed of a conductive paste containing nickel, copper, palladium, or alloys thereof.

2. The composite electronic component of claim 1, further comprising: a first plating layer and a second plating layer formed on exposed portions of the first conductive resin layer and the second conductive resin layer, and the first external electrode and the second external electrode.

3. The composite electronic component of claim 2, wherein in each of the first plating layer and the second plating layer, a width of a portion overlapping the first surface is greater than a width of a portion overlapping the second surface.

4. The composite electronic component of claim 2, wherein in each of the first plating layer and the second plating layer, a width of a portion overlapping the first surface is equal to a width of a portion overlapping the second surface.

5. The composite electronic component of claim 1, wherein in each of the first external electrode and the second external electrode, a width of a portion formed on the second surface is greater than a width of a portion formed on the first surface.

6. The composite electronic component of claim 1, wherein the discharge layer includes a conductive polymer.

7. The composite electronic component of claim 6, wherein the conductive polymer is a silicone-based resin.

8. The composite electronic component of claim 1, wherein the first and second conductive resin layers include an epoxy resin.

9. A board having a composite electronic component mounted thereon, comprising:

a board having a plurality of electrode pads on an upper part thereof;

the composite electronic component of claim 1 installed above the board; and solder connecting an electrode pad of the plurality of electrode pads to the composite electronic component.

10. A composite electronic component comprising:

a composite including:

a capacitor body including a plurality of dielectric layers, a plurality of first internal electrodes and a plurality of second internal electrodes alternately disposed with at least one of the plurality of dielectric layers interposed therebetween, and a first surface and a second surface opposing each other, a third surface and a fourth surface connecting the first surface and the second surface and opposing each other, and a fifth surface and a sixth surface connecting the first surface and the second surface, and connecting the third surface and the fourth surface, while opposing each other, and in which the plurality of first internal electrodes and the plurality of second internal electrodes are exposed to the third surface and the fourth surface, respectively, a first external electrode extending from the third surface of the capacitor body to portions of the first surface, the second surface, the fifth surface, and the sixth surface, and a second external electrode extending from the fourth surface of the capacitor body to portions of the first surface, the second surface, the fifth surface, and the sixth surface, a discharge layer disposed between the first external electrode and the second external electrode on the second surface of the capacitor body, and a protective later disposed on the first external electrode, the second external electrode, and the discharge layer, on the second surface of the capacitor body;

a first conductive resin layer overlapping the third surface and portions of the first surface, the second surface, the fifth surface, and the sixth surface; and a second conductive resin layer overlapping the fourth, surface and portions of the first surface, the second surface, the fifth surface, and the sixth surface;

wherein widths of portions of the first external electrode and the second external electrode formed on the first surface of the capacitor body are greater than widths of portions of the first conductive resin layer and the second conductive resin layer overlapping the first surface of the capacitor body, respectively, wherein B/A is 0.03 to 0.98 in which A is widths of portions of the first external electrode and the second external electrode formed on the first surface of the capacitor body, and B is widths of portions of the first conductive resin layer and the second conductive resin layer overlapping the first surface of the capacitor body, and wherein the first and second external electrodes are formed of a conductive paste including nickel, copper, tin, or alloys thereof.

\* \* \* \* \*